United States Patent
Saga et al.

(10) Patent No.: US 9,425,348 B2
(45) Date of Patent: Aug. 23, 2016

(54) GROUP III NITRIDE SEMICONDUCTOR DEVICE, AND METHOD FOR FABRICATING GROUP III NITRIDE SEMICONDUCTOR DEVICE

(71) Applicants: Sumitomo Electric Industries, Ltd., Osaka-shi (JP); SONY CORPORATION, Tokyo (JP)

(72) Inventors: Nobuhiro Saga, Osaka (JP); Shinji Tokuyama, Osaka (JP); Kazuhide Sumiyoshi, Osaka (JP); Takashi Kyono, Osaka (JP); Koji Katayama, Osaka (JP); Tatsushi Hamaguchi, Kanagawa (JP); Katsunori Yanashima, Kanagawa (JP)

(73) Assignees: Summitomo Electric Industries, Ltd., Osaka-shi (JP); SONY CORPORATION, Tokyo (JP)

( * ) Notice: Subject to any disclaimer, the term of this patent is extended or adjusted under 35 U.S.C. 154(b) by 0 days.

(21) Appl. No.: 14/521,124

(22) Filed: Oct. 22, 2014

(65) Prior Publication Data
US 2015/0115312 A1    Apr. 30, 2015

(30) Foreign Application Priority Data
Oct. 24, 2013   (JP) .................................. 2013-221285

(51) Int. Cl.
*H01L 33/00* (2010.01)
*H01L 33/32* (2010.01)
*H01L 33/16* (2010.01)

(52) U.S. Cl.
CPC ....... *H01L 33/0095* (2013.01); *H01L 33/0075* (2013.01); *H01L 33/32* (2013.01); *H01L 33/16* (2013.01); *H01L 33/325* (2013.01)

(58) Field of Classification Search
CPC   H01L 33/0095; H01L 33/0075; H01L 33/32
See application file for complete search history.

(56) References Cited

FOREIGN PATENT DOCUMENTS

| JP | H03-17681 A | 1/1991 |
| JP | 05-183189 A | 7/1993 |
| JP | H08-32115 A | 2/1996 |
| JP | H08-186332 A | 7/1996 |
| JP | H08-269706 A | 10/1996 |

(Continued)

OTHER PUBLICATIONS

Notice of Reasons for Rejection in Japanese Patent Application No. P2013-221285, dated Dec. 8, 2015.

(Continued)

*Primary Examiner* — Amar Movva
(74) *Attorney, Agent, or Firm* — Venable LLP; Michael A. Sartori

(57) ABSTRACT

In a group III nitride semiconductor device according to one aspect of the present invention, in a p-type group III nitride semiconductor region formed on a semi-polar plane substrate, the concentration of hydrogen (H) contained in the p-type group III nitride semiconductor region is 25% or less of the concentration of a p-type dopant therein, and the concentration of oxygen contained in the p-type group III nitride semiconductor region is $5 \times 10^{17}$ atoms/cm$^3$ or lower, and an angle between a normal axis of a primary surface of the semi-polar plane substrate and a c-axis of the semi-polar plane substrate is not lower than 45 degrees and not higher than 80 degrees or not lower than 100 degrees and not higher than 135 degrees in a waveguide axis direction of the group III nitride semiconductor device.

13 Claims, 7 Drawing Sheets

(56) References Cited

FOREIGN PATENT DOCUMENTS

| JP | H11-145518 A | 5/1999 |
|---|---|---|
| JP | 2004/289014 A | 10/2004 |
| JP | 2010-275552 A | 12/2010 |
| JP | 2013-171879 A | 9/2013 |
| WO | WO-2013/011722 A1 | 1/2013 |

OTHER PUBLICATIONS

Notice of Reasons for Rejection in Japanese Patent Application No. P2013-221285, dated Aug. 4, 2015.

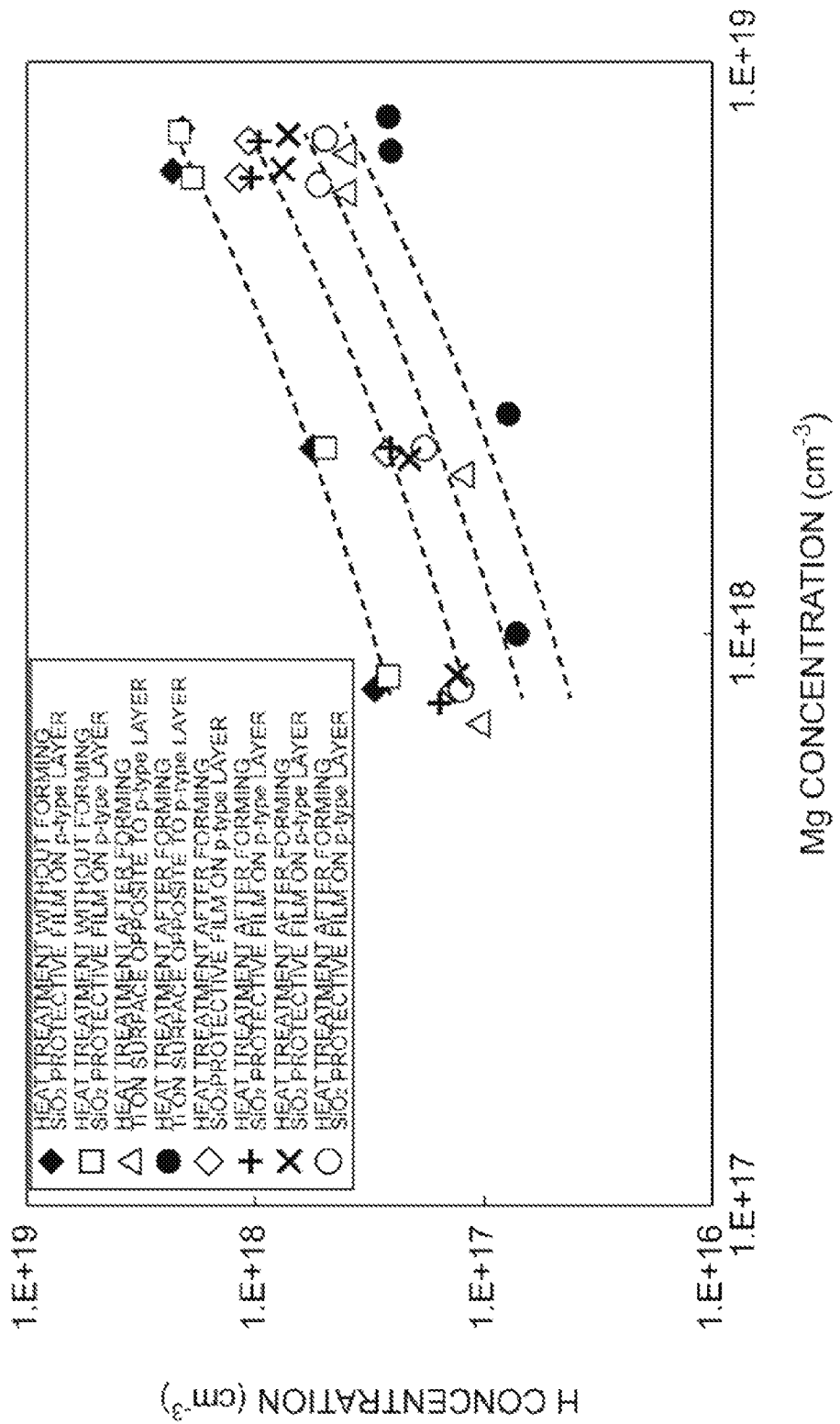

GROUP III NITRIDE SEMICONDUCTOR DEVICE, AND METHOD FOR FABRICATING GROUP III NITRIDE SEMICONDUCTOR DEVICE

BACKGROUND OF THE INVENTION

1. Field of the Invention

The present invention relates to a group III nitride semiconductor device and to a method for fabricating a group III nitride semiconductor device.

2. Related Background Art

Japanese Patent Application Publication No. H05-183189 discloses a method for producing a p-type gallium nitride-based compound semiconductor.

SUMMARY OF THE INVENTION

Japanese Patent Application Publication No. H05-183189 discloses annealing a gallium nitride-based compound semiconductor by using a film which is made of $SiO_2$ grown by means of a plasma CVD method.

In the teaching of researches conducted by the inventors of the present invention, a film, such as SiN, $SiO_2$ or SiON, deposited by plasma CVD has a hydrogen concentration of approximately $1\times10^{21}$ to $1\times10^{22}$ cm$^{-3}$, and most of hydrogen atoms in the film is incorporated in the form of Si—OH bonds. These Si—OH bonds gradually decompose in an environment of approximately 1000 degrees Celsius or more to create active hydrogen (H) atoms. In addition, deposited films formed by plasma CVD have a hydrogen passivation effect on a gallium nitride-based compound semiconductor surface.

Hydrogen in this film is detrimental to the activation of a p-type dopant. In addition, to form a p-type semiconductor region by removing hydrogen from a group III nitride semiconductor formed on a semi-polar surface of a semiconductor region is more difficult as compared with that formed on a c-plane surface of a semiconductor region, resulting in difficulty in activation of a p-type dopant.

An object of one aspect of the present invention is to provide a method for fabricating a semiconductor device by facilitating activation of a p-type dopant in a group III nitride semiconductor, and to provide a semiconductor device having a group III nitride semiconductor with a p-type dopant by facilitated activation. In addition, an object of another aspect of the present invention is to provide a method for fabricating a p-type group III nitride semiconductor, which can facilitate activation of a p-type dopant in a group III nitride semiconductor. Furthermore, an object of still another aspect of the present invention is to provide a p-type group III nitride semiconductor on a semi-polar surface.

In a group III nitride semiconductor device according to one aspect of the present invention, in a p-type group III nitride semiconductor region formed on a semi-polar plane substrate, the concentration of hydrogen (H) contained in the p-type group III nitride semiconductor region is 25% or less of the concentration of a p-type dopant therein, and the concentration of oxygen contained in the p-type group III nitride semiconductor region is $5\times10^{17}$ atoms/cm$^3$ or lower, and an angle between a normal axis of a primary surface of the semi-polar plane substrate and a c-axis of the semi-polar plane substrate is not lower than 45 degrees and not higher than 80 degrees or not lower than 100 degrees and not higher than 135 degrees in a waveguide axis direction in the group III nitride semiconductor device.

A method for fabricating a group III nitride semiconductor device according to another aspect of the present invention includes the steps of: growing a low hydrogen content film, the low hydrogen content film having a hydrogen concentration of $1\times10^{20}$ cm$^{-3}$ or lower, the semiconductor region including a group III nitride semiconductor layer, the group III nitride semiconductor layer comprising a p-type dopant, the low hydrogen content film being made of a material different from group III nitride, and an angle between a normal axis of a primary surface of a semi-polar plane substrate and a c-axis of the semi-polar plane substrate is not lower than 45 degrees and not higher than 80 degrees or not lower than 100 degrees and not higher than 135 degrees in a waveguide axis direction in the group III nitride semiconductor device; and after growing the low hydrogen content film, subjecting the semiconductor region to activation annealing to form a p-type group III nitride semiconductor layer from the group III nitride semiconductor layer.

A group III nitride semiconductor device according to one aspect of the present invention comprises a p-type group III nitride semiconductor region provided on a semi-polar surface of a substrate, a concentration of hydrogen (H) of the p-type group III nitride semiconductor region being 25% or less of a p-type dopant concentration of the p-type group III nitride semiconductor region, an oxygen concentration of the p-type group III nitride semiconductor region being $5\times10^{17}$ atoms/cm$^3$ or lower, a c-axis of the substrate forming an angle with a normal axis of the primary surface of the substrate, the angle being in a range of not lower than 45 degrees and not larger than 80 degrees or not smaller than 100 degrees and not larger than 135 degrees, the group III nitride semiconductor device including a waveguide, and the waveguide extending along a reference plane defined by the c-axis and the normal axis.

BRIEF DESCRIPTION OF THE DRAWINGS

The above-described object and other objects, features, and advantages of the present invention will be apparent from the detailed description of the embodiments of the present invention with reference to the accompanying drawings.

FIG. 7 is a drawing showing the relationship between Mg concentration and H concentration under different types of annealing treatment.

DESCRIPTION OF THE PREFERRED EMBODIMENTS

Figure 1:
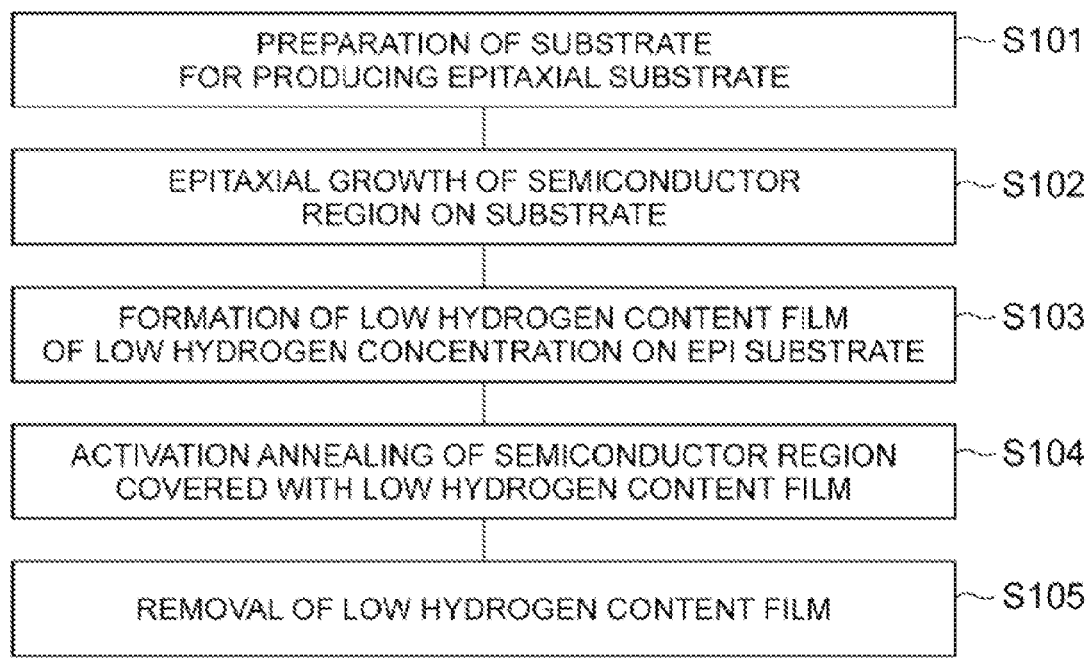
FIG. 1 shows a process flow that includes the main in a method for fabricating a p-type group III nitride semiconductor and a method for fabricating a semiconductor device according to the present embodiment.

Modes of the present invention will now be explained. In a group III nitride semiconductor device according to one mode of the present invention, in a p-type group III nitride semiconductor region formed on a semi-polar plane substrate, the concentration of hydrogen contained in the p-type group III nitride semiconductor region is 25% or less of the concentration of a p-type dopant, the concentration of oxygen contained in the p-type group III nitride semiconductor region is $5 \times 10^{17}$ atoms/cc or lower, and an angle formed by a normal axis of a primary surface of the semi-polar plane substrate and a c-axis of the semi-polar plane substrate is not lower than 45 degrees and not higher than 80 degrees or not lower than 100 degrees and not higher than 135 degrees in a waveguide direction of the group III nitride semiconductor device extends. In this group III nitride semiconductor device, a wavelength of light that the semiconductor device emits is in the range of not lower than 480 nm and not higher than 550 nm.

A method for fabricating a group III nitride semiconductor device according to one mode of the present invention includes the steps of: growing a low hydrogen content film on a semiconductor region including a group III nitride semiconductor layer that contains a p-type dopant, the low hydrogen content film having a hydrogen concentration of $1 \times 10^{20}$ cm$^{-3}$ or lower; and carrying out activation annealing of the semiconductor region to form a p-type group III nitride semiconductor layer from the group III nitride semiconductor layer, after growing the low hydrogen content film, wherein the low hydrogen content film comprises a material that is different from the group III nitride, and an angle formed by a normal axis of a primary surface of a semi-polar plane substrate and a c-axis of the semi-polar plane substrate is not lower than 45 degrees and not higher than 80 degrees or not lower than 100 degrees and not higher than 135 degrees in a waveguide axis direction. In this production method, the step of growing the low hydrogen content film may include growing the low hydrogen content film in a film formation apparatus without using a substance that contains hydrogen. In addition, the temperature of the activation annealing is preferably 600 degrees Celsius or higher in this production method. Furthermore, in this method for producing a group III nitride semiconductor device, the low hydrogen content film may include a dielectric body.

In this mode, the low hydrogen content film may contain at least one of a silicon oxide, a zirconium oxide, an aluminum oxide, a titanium oxide or a tantalum oxide. In addition, in this mode, the low hydrogen content film may include a metal that has hydrogen storage properties. Furthermore, in this mode, the low hydrogen content film may contain at least one of titanium (Ti), palladium (Pd), nickel (Ni), cobalt (Co), platinum (Pt) or rhodium (Rh).

In this mode, the low hydrogen content film may be formed by a vapor phase growth method. In addition, in this mode, the low hydrogen content film is formed by an evaporation method. Furthermore, in this mode, the low hydrogen content film may be formed using an electron beam vapor deposition method.

The production method according to the present mode may further include the step of, after the step of forming the p-type group III nitride semiconductor layer, removing the low hydrogen content film to expose the surface of the semiconductor region having the p-type group III nitride semiconductor layer. In addition, the production method according to the present mode may include the step of, after the step of forming the p-type group III nitride semiconductor layer, processing the p-type group III nitride semiconductor layer so as to form a ridge structure, wherein the ridge structure extends along a reference plane defined by the c-axis and the m- or a-axis of the semi-polar plane substrate. In this mode, the group III nitride semiconductor layer may include at least one of a Mg-doped GaN layer, a Mg-doped AlN layer, a Mg-doped InN layer, a Mg-doped AlGaN layer, a Mg-doped InGaN layer, a Mg-doped InAlGaN layer or a Mg-doped InAlN layer.

In a p-type group III nitride semiconductor formed on a semi-polar surface according to one mode of the present invention, in a p-type group III nitride semiconductor region formed on a semi-polar plane substrate made of a group III nitride semiconductor, the concentration of hydrogen (H) contained in the p-type layer is 25% or less of the concentration of a p-type dopant, and the concentration of oxygen contained in the p-type layer is $5 \times 10^{17}$ atoms/cm$^3$ or lower.

One mode of the present invention is directed to a method for producing a p-type group III nitride semiconductor. This method includes: (a) a step of growing a low hydrogen content film, having a hydrogen concentration of $1 \times 10^{20}$ cm$^{-3}$ or lower, on a semiconductor substrate including a group III nitride semiconductor layer that contains a p-type dopant, the low hydrogen content film having ability to absorb hydrogen; and (b) a step of subjecting the semiconductor region to activation annealing to form a p-type group III nitride semiconductor layer from the group III nitride semiconductor layer, after growing the low hydrogen content film. The low hydrogen content film is made of a material different from the group III nitride. Here, the low hydrogen content film may be in contact with the p-type group III nitride semiconductor, for example, via an additional layer provided between the p-type group III nitride semiconductor and the low hydrogen content film, and alternatively the low hydrogen content film may be in direct contact with the p-type group III nitride semiconductor.

According to this method for producing a p-type group III nitride semiconductor, prior to carrying out the activation annealing, the low hydrogen content film of a material different from the group III nitride is grown on the group III nitride semiconductor layer to form a substrate product, and the substrate product thus formed is heat-treated. Hydrogen is bonded to the p-type dopant in the group III nitride semiconductor layer before the activation annealing. Since the low hydrogen content film has a low concentration of hydrogen, undesired generation of hydrogen hardly occurs during the activation annealing. The low hydrogen content film that has a hydrogen concentration of $1 \times 10^{20}$ cm$^{-3}$ or lower allows for the more effective activation and facilitates discharge of hydrogen via the low hydrogen content film.

One mode of the present invention is directed to a method for producing a p-type group III nitride semiconductor. This method includes (a) a step of growing a low hydrogen content film, having a hydrogen content of $1 \times 10^{20}$ cm$^{-3}$ or lower, on a semiconductor substrate, the semiconductor substrate including a group III nitride semiconductor layer, the group III nitride semiconductor layer comprising a p-type dopant; and (b) a step of, after growing the low hydrogen content film, subjecting the semiconductor region to activation annealing to form a p-type group III nitride semiconductor layer from the group III nitride semiconductor layer. The low hydrogen content film is formed of a material that is different from the group III nitride. Here, the low hydrogen content film may be directly connected to the p-type group III nitride semiconductor or indirectly connected to the p-type group III nitride semiconductor via another layer therebetween.

According to this method for producing a p-type group III nitride semiconductor, the low hydrogen content film having a hydrogen content of $1\times10^{20}$ cm$^{-3}$ or lower is grown before activation annealing is carried out. The concentration of hydrogen in this low hydrogen content film is made low, and the group III nitride semiconductor layer including a p-type dopant has a hydrogen concentration higher than the low hydrogen content film. The low hydrogen content film hardly generates unwanted hydrogen during the activation annealing, so that the low hydrogen content film makes more effective activation possible, thereby facilitating discharge of hydrogen via the low hydrogen content film.

In the method for producing a p-type group III nitride semiconductor according to one mode of the present invention, it is preferable that the semiconductor region include a semi-polar surface that is in contact with the low hydrogen content film and that the semi-polar surface be made of a group III nitride semiconductor. According to this method for producing a p-type group III nitride semiconductor, it is harder that hydrogen is removed from the group III nitride semiconductor on a semi-polar surface of the semiconductor region than on a c-plane of a semiconductor region.

In the method for producing a p-type group III nitride semiconductor according to one mode of the present invention, it is preferable that the temperature of the activation annealing be 600 degrees Celsius or higher, and more preferably 800 degrees Celsius or higher. The heat treatment in the above temperature range can facilitate the discharge of hydrogen from the group III nitride semiconductor grown on the semi-polar surface.

In the method for producing a p-type group III nitride semiconductor according to one mode of the present invention, it is preferable that the low hydrogen content film comprising a dielectric body or a metal that have excellent hydrogen storage nature. According to this method for producing a p-type group III nitride semiconductor, such a dielectric material easily provides a film that does not cause interdiffusion to the surface of the group III nitride semiconductor.

In the method for producing a p-type group III nitride semiconductor according to one mode of the present invention, it is preferable that the low hydrogen content film be formed using a vapor phase growth method in an embodiment in which the dielectric body is used as a low hydrogen content film. According to this method for producing a p-type group III nitride semiconductor, dry process, such as vapor phase growth method, easily prevents the low hydrogen content film from being contaminated in its formation as compared with a wet process.

In the method for producing a p-type group III nitride semiconductor according to one mode of the present invention, it is preferable that the low hydrogen content film be formed using an evaporation method. According to this method for producing a p-type group III nitride semiconductor, the formation of the low hydrogen content film by evaporation can reduce the amount of hydrogen incorporated therein during the formation and causes little damage to the surface of the group III nitride semiconductor during the formation thereof.

In the method for producing a p-type group III nitride semiconductor according to one mode of the present invention, the low hydrogen content film may comprise at least one of a silicon oxide (for example, $SiO_2$), a zirconium oxide (for example, $ZrO_2$), an aluminum oxide (for example, $Al_2O_3$), a titanium oxide (for example, $TiO_2$), a tantalum oxide (for example, $Ta_2O_5$), titanium (Ti), palladium (Pd), nickel (Ni), cobalt (Co), platinum (Pt) or rhodium (Rh).

According to this method for producing a p-type group III nitride semiconductor, when the low hydrogen content film of one or more of the above materials forms a junction with the group III nitride semiconductor, the interdiffusion hardly occurs through the boundary between the low hydrogen content film and the semiconductor. In addition, by using the low hydrogen content film of one or more of these materials, it is easy to form the low hydrogen content film by a vapor deposition method.

A method for producing a p-type group III nitride semiconductor according to one mode of the present invention can further include the step of, after the step of forming the p-type group III nitride semiconductor layer, removing the low hydrogen content film. According to this method for producing a p-type group III nitride semiconductor, since the low hydrogen content film can be removed after being used in the heat treatment, it is possible to avoid complexities caused by the low hydrogen content film that is left without removal. Alternatively, it is possible that the low hydrogen content film is patterned by partly removing the low hydrogen content film by use of photolithography and wet or dry etching and that the patterned low hydrogen content film may be used as a mask for subsequent dry etching.

In the method for producing a p-type group III nitride semiconductor according to one mode of the present invention, it is preferable to remove the low hydrogen content film to expose the p-type group III nitride semiconductor layer at the surface of the semiconductor region. According to this method for producing a p-type group III nitride semiconductor, in the activation annealing, the low hydrogen content film can reduce the occurrence of degenerations that have an adverse effect on the properties of the semiconductor, such as loss of atoms from the surface of the p-type group III nitride semiconductor layer and reactions with reactive gas present in the processing atmosphere.

In the method for producing a p-type group III nitride semiconductor according to one mode of the present invention, the low hydrogen content film can be in physical contact with the group III nitride semiconductor layer. According to this method for producing a p-type group III nitride semiconductor, the physical contact allows hydrogen atoms to migrate from the group III nitride semiconductor layer, which has a higher hydrogen concentration to the low hydrogen content film, which has a lower hydrogen concentration.

In the method for producing a p-type group III nitride semiconductor according to the present invention, the low hydrogen content film can be in contact with the p-type group III nitride semiconductor layer via another member located therebetween. According to this method for producing a p-type group III nitride semiconductor, hydrogen atoms can migrate through the other member from the group III nitride semiconductor layer of a higher hydrogen concentration to the low hydrogen content film of a lower hydrogen concentration.

A method for producing a p-type group III nitride semiconductor according to one mode of the present invention may further include the steps of: preparing a substrate having a primary surface of a hexagonal group III nitride; and forming the semiconductor region on the primary surface of the substrate by an organometallic vapor phase growth method. The angle between the normal axis of the primary surface of the substrate and the c-axis of the group III nitride substrate is not lower than 45 degrees and not higher than 80 degrees or not lower than 100 degrees and not higher than 135 degrees in the direction of the axis along which the waveguide extends; and in the step of growing on the semiconductor region, the group III nitride semiconductor layer can be grown on the primary surface by an organometallic vapor phase growth method.

According to this method for producing a p-type group III nitride semiconductor, hydrogen is less likely to be removed in the semi-polar plane within the above angle ranges than in the c-plane.

In the method for producing a p-type group III nitride semiconductor according to one mode of the present invention, the group III nitride semiconductor layer may include at least one of a Mg-doped GaN layer, a Mg-doped AlN layer, a Mg-doped InN layer, a Mg-doped AlGaN layer, a Mg-doped InGaN layer, a Mg-doped InAlGaN layer or a Mg-doped InAlN layer. In addition, these layers may contain boron (B).

According to this method for producing a p-type group III nitride semiconductor, the group III nitride semiconductor may be subjected to activation annealing.

One mode of the present invention relates to a method for producing a semiconductor device including a group III nitride semiconductor. This method comprise the steps of (a) growing a low hydrogen content film on a semiconductor substrate, the low hydrogen content film having a hydrogen concentration of $1 \times 10^{20}$ cm$^{-3}$ or lower, the semiconductor substrate including a group III nitride semiconductor layer, and the group III nitride semiconductor layer including a p-type dopant; and (b) after growing the low hydrogen content film, applying activation annealing to the semiconductor region to form a p-type group III nitride semiconductor layer from the group III nitride semiconductor layer. The low hydrogen content film is made of a material that is different from the group III nitride.

According to this method for fabricating a semiconductor device, in order to carry out the activation annealing, the low hydrogen content film of the material that is different from the group III nitride is grown on the semiconductor substrate to form a substrate product, and then the substrate product is heat-treated. Hydrogen is bonded to the p-type dopant in the group III nitride semiconductor layer. Since the low hydrogen content film hardly generates unwanted hydrogen during the activation annealing, more effective activation is made possible. Accordingly, the low hydrogen content film of a hydrogen concentration of $1 \times 10^{20}$ cm$^{-3}$ or lower is advantageous in terms of discharging hydrogen from the group III nitride semiconductor layer via the low hydrogen content film.

In the method for fabricating a semiconductor device according to one mode of the present invention, it is preferable that the temperature of the activation annealing be 600 degrees Celsius or higher, and more preferably 800 degrees Celsius or higher. This method of fabricating a semiconductor device can facilitate the discharge of hydrogen in the heat treatment temperature range as above.

In the method for fabricating a semiconductor device according to one mode of the present invention, when a dielectric material is applied to the low hydrogen content film, it is preferable that the low hydrogen content film be formed using a vapor phase growth method. According to this method for fabricating a semiconductor device, the vapor phase growth of the low hydrogen content film makes it easier to avoid contamination in the formation of the low hydrogen content film than a wet process.

In the method for fabricating a semiconductor device according to one mode of the present invention, it is preferable that the low hydrogen content film be formed using an evaporation method. According to this method for fabricating a semiconductor device, the evaporation coating of the low hydrogen content film makes it possible to reduce the amount of hydrogen incorporated therein during the film formation, and causes little damage to the surface of the group III nitride semiconductor during the film formation.

In the method for fabricating a semiconductor device according to one mode of the present invention, it is preferable that the low hydrogen content film contain at least one of a silicon oxide (for example, $SiO_2$), a zirconium oxide (for example, $ZrO_2$), an aluminum oxide (for example, $Al_2O_3$), a titanium oxide (for example, $TiO_2$), a tantalum oxide (for example, $Ta_2O_5$), titanium (Ti), palladium (Pd), nickel (Ni), cobalt (Co), platinum (Pt) or rhodium (Rh).

According to this method for fabricating a semiconductor device, when the low hydrogen content film comprising the above material forms a junction with a group III nitride semiconductor, the combination of the low hydrogen content film of the above material with the group III nitride semiconductor hardly causes interface interdiffusion at the junction between the low hydrogen content film and the semiconductor. In addition, using these materials makes it easy to form the low hydrogen content film by a vapor deposition method.

A method for fabricating a semiconductor device according to one mode of the present invention may further comprise the step of removing the low hydrogen content film after the step of forming the p-type group III nitride semiconductor layer.

According to this method for fabricating a semiconductor device, the low hydrogen content film may be removed after being used in the heat treatment, and this removal makes it possible to avoid complexities caused by the low hydrogen content film left for other purposes. The low hydrogen content film can prevent atoms from being released in the activation annealing from the surface of the p-type group III nitride semiconductor layer prepared for the device. Hydrogen atoms migrate from the group III nitride semiconductor layer, which has a higher hydrogen concentration, to the low hydrogen content film, which has a lower hydrogen concentration.

A method for fabricating a semiconductor device according to one mode of the present invention may further comprise the steps of: preparing a substrate having a primary surface of a group III nitride of hexagonal crystal type; and forming a semiconductor region on the primary surface of the substrate. The angle formed by the normal axis of the primary surface of the substrate and the c-axis of the group III nitride of the substrate is not lower than 45 degrees and not higher than 80 degrees or not lower than 100 degrees and not higher than 135 degrees in the waveguide axis direction, and in the step of growing the semiconductor region, the group III nitride semiconductor layer can be grown on the primary surface by an organometallic vapor phase growth method.

According to the method for fabricating a semiconductor device, hydrogen is far less likely to be removed in the semi-polar plane within the above angle ranges than in the c-plane.

A method for fabricating a semiconductor device according to one mode of the present invention may further comprise the steps of: forming a metal layer on the p-type group III nitride semiconductor layer after the low hydrogen content film has been removed; and forming a ridge structure on the semiconductor region after the metal layer has been formed. The low hydrogen content film is in contact with the group III nitride semiconductor layer.

According to the method for fabricating a semiconductor device, the low hydrogen content film can be in contact with the p-type group III nitride semiconductor layer, and in this case, it is possible to protect the surface, which is in contact with the metal layer, of the p-type group III nitride semiconductor layer following the step of activation annealing.

In the method for fabricating a semiconductor device according to one mode of the present invention, the metal layer may comprise palladium. According to this method for fabricating a semiconductor device, the palladium (Pd) enables excellent ohmic contact.

In the method for fabricating a semiconductor device according to one mode of the present invention, the group III nitride semiconductor layer may contain at least one of a Mg-doped GaN layer, a Mg-doped AlN layer, a Mg-doped InN layer, a Mg-doped AlGaN layer, a Mg-doped InGaN layer, a Mg-doped InAlGaN layer or a Mg-doped InAlN layer. In addition, these layers may comprise boron (B).

According to this method for fabricating a semiconductor device, the activation annealing may be applied to the above group III nitride semiconductor. This fabrication method enables the p-type dopant to be activated in a variety of group III nitride semiconductors that constitute the semiconductor device.

The method for fabricating a semiconductor device according to one mode of the present invention further comprises the step of growing an active layer prior to the growth of the group III nitride semiconductor layer.

In the method for fabricating a semiconductor device according to one mode of the present invention, the emission wavelength of the semiconductor device may be in the range of not lower than 480 nm and not higher than 550 nm. According to this method for fabricating a semiconductor device, the use of a semi-polar surface enables the formation of the active layer that has a long emission wavelength, and the p-type group III nitride semiconductor in this light-emitting device can be provided with good performance.

In the method for fabricating a semiconductor device according to one mode of the present invention, the emission wavelength of the semiconductor device may be in the range of not lower than 510 nm and not higher than 540 nm. According to this method for fabricating a semiconductor device, the use of a semi-polar surface enables the formation of the active layer that has an emission wavelength in the green wavelength region, and enables the production of a p-type group HI nitride semiconductor with excellent p-type characteristics in this light-emitting device.

In the method for fabricating a semiconductor device according to one mode of the present invention, the low hydrogen content film may be formed using an electron beam vapor deposition method. According to this method for fabricating a semiconductor device, the electron beam vapor deposition of the low hydrogen content film can reduce the amount of hydrogen that may be incorporated therein during the film formation.

In the method for fabricating a semiconductor device according to one mode of the present invention, the low hydrogen content film may be grown at a temperature of more than 100 degrees Celsius. According to this method for fabricating a semiconductor device, the growth at the temperature over 100 degrees Celsius can reduce the amount of hydrogen, which is generated by decomposition of moisture during the film formation, incorporated into the low hydrogen content film.

In the method for fabricating a semiconductor device according to one mode of the present invention, the low hydrogen content film can be grown at a temperature of 300 degrees Celsius or higher. According to this method for fabricating a semiconductor device, migration of constituent elements of the low hydrogen content film can be facilitated during the growth of the low hydrogen content film. This migration can contribute to the formation of a dense film.

In the method for fabricating a semiconductor device according to one mode of the present invention, the low hydrogen content film can be grown at a temperature of 400 degrees Celsius or lower. According to this method for fabricating a semiconductor device, it is possible to reduce roughening of the surface of the semiconductor region, which may occur when the low hydrogen content film is grown thereon.

The teaching of the invention can be easily understood through the detailed description described below with reference to the accompanying exemplary drawings. With reference to the appended drawings, explanations will be given of embodiments relating to the method for producing a p-type group III nitride semiconductor and method for fabricating a semiconductor device of the present invention. Wherever possible, the same parts are given the same reference symbols.

FIG. 1 shows a process flow that includes the primary steps in the method for activating a semiconductor doped with p-type element, a method for producing a p-type group III nitride semiconductor and a method for fabricating a semiconductor device according to the present embodiment. FIGS. 2A, 2B, 3A, 3B, 4A and 4B are drawings that schematically illustrate the primary steps in a method according to the present embodiment.

Figure 2A:
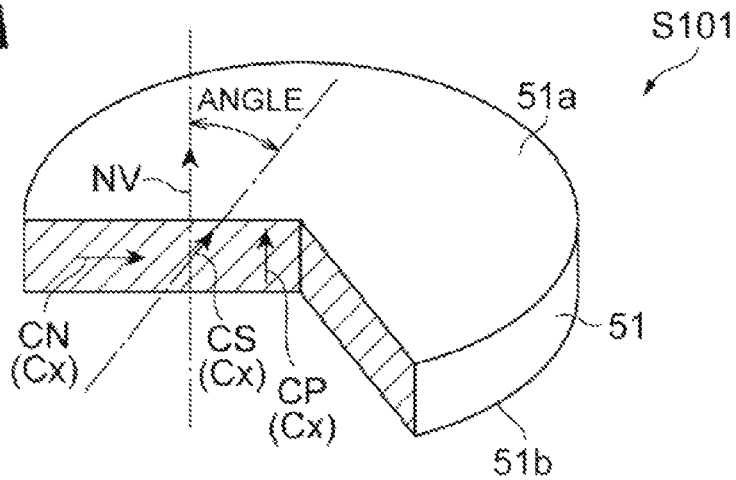
FIG. 2A is a drawing that schematically illustrates a main step in the method according to the present embodiment.

As shown in FIG. 2A, a substrate 51 is prepared in step S101. This substrate 51 may have a primary surface 51a and a back surface 51b, and the primary surface 51a may comprise, for example, a group III nitride of a hexagonal crystal type. This substrate 51 can be, for example, a group III nitride substrate, and the group III nitride substrate can be, for example, a GaN substrate. The primary surface 51a of a group III nitride can comprise, for example, a semi-polar surface or a non-polar surface. FIG. 2A shows three types of c-axis vectors (referred to as "CP," "CS" and "CN") that are used to indicate the direction of the c-axis in the respective group III nitride substrates. The c-axis "Cx" of the group III nitride substrate is aligned in any one of these directions. The slope of the c-axis "Cx" is defined as an angle of inclination (ANGLE) relative to the vector NV normal to the primary surface 51a. In addition, the inclination direction of the c-axis "Cx" can be defined using, as a reference, a plane defined by any two of the c-axis, m-axis and a-axis in a hexagonal crystal system.

Figure 2B:
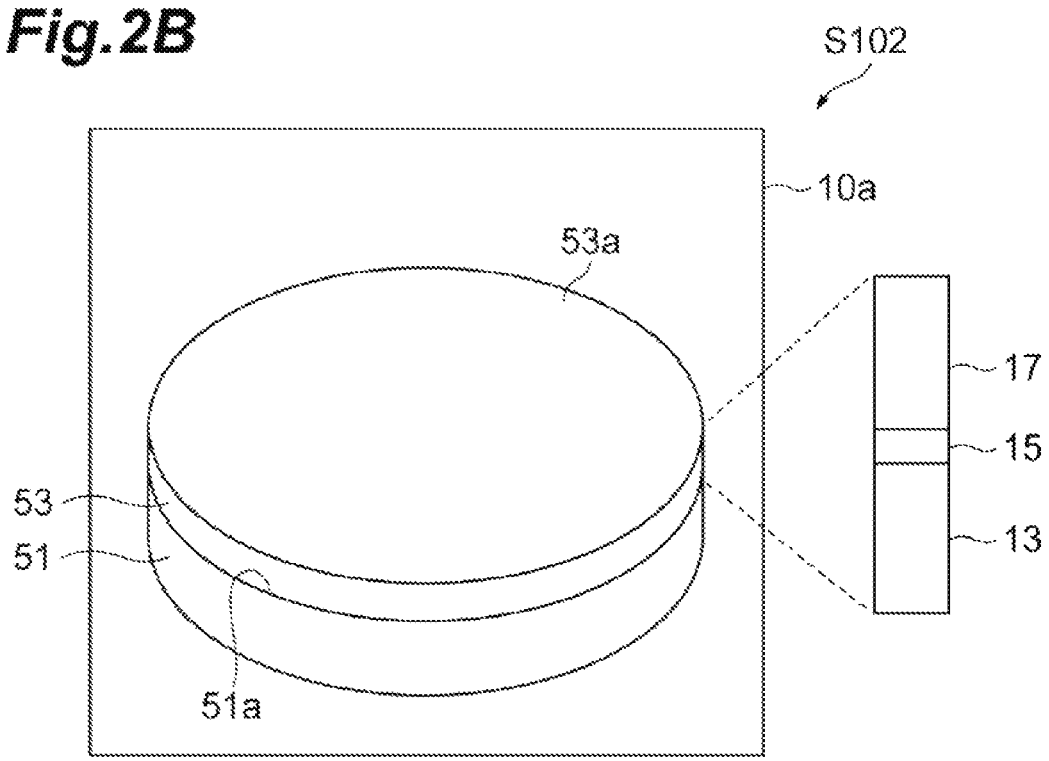
FIG. 2B is a drawing that schematically illustrates a main step in the method according to the present embodiment.

As shown in FIG. 2B, in step S102, a semiconductor region 53 is grown in a growth reactor 10a on the primary surface 51a of the substrate 51. This growth can be carried out by means of, for example, an organometallic vapor phase growth method or molecular beam epitaxy method. The surface 53a of the semiconductor region 53 corresponds to the orientation of the primary surface 51a. Regardless of the type of semiconductor devices, the semiconductor region 53 includes a group III nitride semiconductor layer that contains a p-type dopant. The group III nitride semiconductor region which contains one or more p-type elements can be formed not only by epitaxial growth, but also by another method, such as, ion implantation.

The semiconductor region 53 used to form a light-emitting device includes a first group-III nitride semiconductor region 13, an active layer 15 and a second group-III nitride semiconductor region 17. The active layer 15 is provided between the first group-III nitride semiconductor region 13 and the second group-III nitride semiconductor region 17. The orientation of the epi-surface of the first group-III nitride semiconductor region 13 corresponds to the orientation of the primary surface 51a. The orientation of the epi-surface of the active layer 15 corresponds to the orientation of the primary surface 51a. The orientation of the epi-surface of the second group-III nitride semiconductor region 17 corresponds to the orientation of the primary surface 51a. At least one of the first group-III nitride semiconductor region 13 or the second group-III nitride semiconductor region 17 includes a group III nitride semiconductor layer to which is intentionally doped with a p-type dopant. The group III nitride semiconductor layer can include, for example, at least one of Mg-doped GaN, Mg-doped AlN, Mg-doped InN, Mg-doped AlGaN, Mg-doped InGaN, Mg-doped InAlGaN or Mg-doped InAlN. In addition, these layers may contain boron (B). The group III nitride semiconductor may be subjected to activation annealing. This production method enables the activation of the p-type dopant in a variety of group III nitride semiconductors that constitute the semiconductor device. In addition, the group III nitride semiconductor layer corresponds to a semiconductor layer with p-type conductivity, such as a p-type optical guiding layer, a p-type cladding layer, a p-type contact layer or a p-type electron blocking layer.

In most cases, the growth of the active layer 15 is carried out prior to growing the group III nitride semiconductor layer that contains a p-type dopant. When the primary surface 51a of the substrate 51 comprises a semi-polar surface, the lasing wavelength of the active layer may be not lower than 480 nm and not higher than 550 nm. The use of semi-polar orientation enables the formation of an active layer that can emit light of a long wavelength. In this light-emitting device, a p-type group III nitride semiconductor with good characteristics can be produced by subjecting the group III nitride semiconductor layer to annealing in a subsequent step. In addition, the emission wavelength of the active layer may be not lower than 510 nm and not higher than 540 nm. The use of a semi-polar surface enables an active layer to emit light of a wavelength in the green region.

Figure 3A:
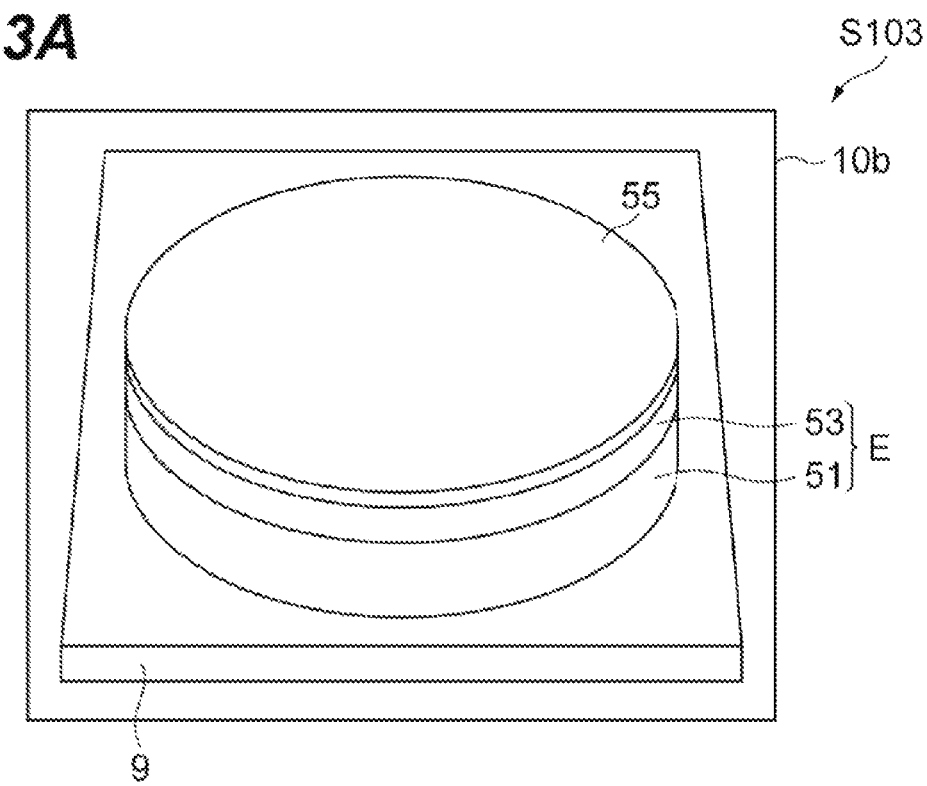
FIG. 3A is a drawing that schematically illustrates a main step in the method according to the present embodiment.

As shown in FIG. 3A, a low hydrogen content film 55 is formed on the semiconductor region 53 of an epitaxial substrate E in step S103. Deposition of the low hydrogen content film 55 is carried out using a film formation reactor 10b. As already explained above, the semiconductor region 53 includes a group III nitride semiconductor layer doped with a p-type dopant. The p-type dopant contained in the group III nitride semiconductor layer can be, for example, magnesium (Mg), zinc (Zn), beryllium (Be), or the like. The low hydrogen content film 55 can be formed of a material different from the group III nitride. The concentration of the p-type dopant in the group III nitride semiconductor layer is not lower than $5 \times 10^{16}$ cm$^{-3}$ and not higher than $1 \times 10^{21}$ cm$^{-3}$.

The low hydrogen content film 55 may have a hydrogen concentration of, for example, $1 \times 10^{20}$ cm$^{-3}$ or lower, and preferably $1 \times 10^{18}$ cm$^{-3}$ or lower.

The low hydrogen content film 55 is formed in the film forming reactor by a dry process without using a substance (s) (for example, a raw material, a raw material gas, a process gas or a carrier gas) that contains hydrogen, for example, as a constituent element. A vapor phase growth method may be applied to the growth of the low hydrogen content film 55. The use of vapor phase growth rather than a wet process makes it possible to avoid contamination, which may occur when forming the low hydrogen content film 55, in the epitaxial substrate E. In addition, vapor deposition may be applied to the growth of the low hydrogen content film. Using the vapor deposition can reduce the amount of hydrogen introduced into the low hydrogen content film during film formation thereof and there is little damage to the surface of the group III nitride semiconductor during the film formation.

The low hydrogen content film 55 can contain, for example, at least one of a silicon oxide, a zirconium oxide, an aluminum oxide, a titanium oxide, a tantalum oxide, titanium (Ti), palladium (Pd), nickel (Ni), cobalt (Co), platinum (Pt) and rhodium (Rh). When the low hydrogen content film 55 comprising the above material forms a junction with the group III nitride semiconductor, interdiffusion hardly occurs at the boundary between the low hydrogen content film and the semiconductor. In addition, a vapor deposition method can be easily applied to the formation of the low hydrogen content film 55 comprising the above material.

It is possible to use, for example, $SiO_2$ as the silicon oxide, and the deposition method and raw materials can be as follows: electron beam (EB) vapor deposition using bulk $SiO_2$; or reactive sputtering using Si and $O_2$. It is possible to use, for example, $ZrO_2$ as the zirconium oxide, and the deposition method and raw materials can be as follows: EB vapor deposition or sputtering using $ZrO_2$. It is possible to use, for example, $Al_2O_3$ as the aluminum oxide, and the deposition method and raw materials can be as follows: electron beam (EB) vapor deposition using bulk $Al_2O_3$; or reactive sputtering using Al and $O_2$. It is possible to use, for example, $TiO_2$ as the titanium oxide, and the deposition method and raw materials can be as follows: EB vapor deposition using $TiO_2$; or reactive sputtering using Ti and $O_2$. It is possible to use, for example, $Ta_2O_5$ as the tantalum oxide, and the deposition method and raw materials can be as follows: EB vapor deposition using $Ta_2O_5$; or reactive sputtering using Ta and $O_2$. In addition, when forming a metal film, it is possible to use an EB vapor deposition method or a sputtering method.

Growth of the low hydrogen content film 55 can be carried out at a temperature over 100 degrees Celsius. This film formation temperature can be controlled by, for example, adjusting the temperature of the stage 9 in the film formation reactor 10b. By carrying out the film formation at a temperature of more than 100 degrees Celsius (for example, the temperature of the stage or the like), it is possible to reduce the amount of hydrogen that is incorporated into the low hydrogen content film 55 during the film formation in which the hydrogen is generated by decomposition of moisture. In addition, it is preferable for the low hydrogen content film 55 to be grown at a temperature of 300 degrees Celsius or higher. When growing the low hydrogen content film 55, it is possible to facilitate migration of a constituent element(s) of the low hydrogen content film 55, and this migration can contribute to the formation of a dense film, and consequently, forming the dense film by this migration can also contribute to reduction in the amount of residual hydrogen. In addition, it is preferable that the low hydrogen content film 55 be grown at a temperature of 400 degrees Celsius or lower. It is possible to reduce roughening, which may be created when growing the low hydrogen content film, in the surface of the semiconductor region.

Figure 3B:
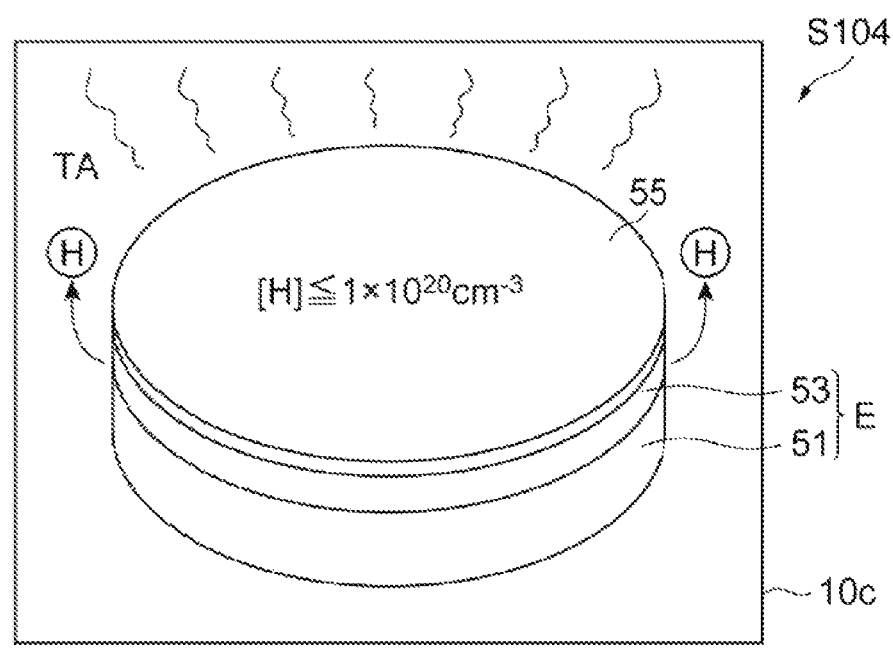
FIG. 3B is a drawing that schematically illustrates a main step in the method according to the present embodiment.

As shown in FIG. 3B, after the low hydrogen content film 55 has been formed, the semiconductor region 53 is subjected to activation annealing in step S104 to change the p-doped group III nitride semiconductor layer to a p-type group III nitride semiconductor layer. This activation annealing is carried out using a heat treatment apparatus 10c. The heat treatment apparatus 10c can be, for example, a lamp annealer. The annealing time is, for example, one minute. In addition, the annealing time can be 30 seconds or longer, and holding the semiconductor region in the heat treatment apparatus 10c for a certain period of time is effective in terms of hydrogen desorption. The annealing time can be 60 minutes or shorter, and if the annealing time is too long, the crystals deteriorate and defects increases therein, resulting in that the luminescence intensity decreases and contact resistance also deteriorates. Moreover, the arrangement of the heat treatment for activation annealing in the production process flow is not limited to the present embodiment, and should satisfy the following condition: the underlying layer located below the low hydrogen content film 55 can withstand the heat treatment for activation annealing. In addition, the low hydrogen content film 55 should be formed at a process step in which at least a part of the semiconductor region 53 is in contact with the low hydrogen content film 55, or in which the semiconductor region 53 is connected with the low hydrogen content of film 55 via a member able to transport hydrogen, thereby providing a hydrogen discharge route from the semiconductor region 53 to the low hydrogen content film 55.

As already explained, the group III nitride semiconductor layer may include at least one of, for example, a Mg-doped GaN layer, a Mg-doped AlN layer, a Mg-doped InN layer, a Mg-doped AlGaN layer, a Mg-doped InGaN layer, a Mg-doped InAlGaN layer or a Mg-doped InAlN layer. In addition, these layers may contain boron (B). The activation annealing can be applied to the above group III nitride semiconductors. This production method enables the activation of the p-type dopant in a variety of group III nitride semiconductors that constitute the semiconductor device. The activation annealing can reduce the concentration of hydrogen in the group III nitride semiconductor layer without substantial change in the p-type dopant concentration in the group III nitride semiconductor layer.

In the activation annealing, the low hydrogen content film 55, which has a low hydrogen concentration, is grown on the semiconductor region 53 (a semiconductor region including a group III nitride semiconductor layer doped with a p-type dopant), and activation annealing is then applied to the semiconductor region 53, thereby forming a p-type group III nitride semiconductor layer from the group III nitride semiconductor layer. In this heat treatment method, heat-treatment for the activation annealing is carried out after forming the low hydrogen content film 55 of a material different from the group III nitride. Hydrogen in the group III nitride semiconductor layer in the semiconductor region 53 is bonded to the p-type dopant. The low hydrogen content film 55 has a low hydrogen concentration, and does not generate unwanted hydrogen during the activation annealing, so that discharge of hydrogen through the low hydrogen content film 55 is facilitated to achieve effective activation. Preferably, the low hydrogen content film 55 with a low hydrogen concentration has a lower hydrogen concentration than, for example, the semiconductor region 53.

The activation annealing temperature (TA) can be, for example, 600 degrees Celsius or higher, and preferably 800 degrees Celsius or higher. The heat treatment in the above temperature range facilitates the discharge of hydrogen. The activation annealing temperature can be 1100 degrees Celsius or lower. If the temperature is too high, the crystallinity of the active layer is made deteriorated to reduce the luminescence intensity, and Ga atoms in the contact layer may diffuse into the low hydrogen content film, resulting in that the contact resistance becomes high.

As already explained, the primary surface 51a (for example, a primary surface of a group III nitride) of the substrate 51 may comprise, for example, a semi-polar surface or a non-polar surface. According to the findings of the inventors, however, hydrogen is unlikely to be removed during activation annealing from a group III nitride grown on a semi-polar surface or from a semi-polar surface of a gallium nitride semiconductor. For example, when a group III nitride or gallium nitride semiconductor formed on a c-plane and a group III nitride or gallium nitride semiconductor formed on a semi-polar plane both are subjected to activation annealing under the same heat treatment conditions, the degree of activation on the c-plane is better than the degree of activation on the semi-polar plane.

Hence, what is needed in heat treatment to activate a group III nitride or gallium nitride semiconductor formed on a semi-polar surface is a means for facilitating the activation. With such a technical background, the findings of the inventors indicate as follows: if the hydrogen concentration in a capping film is high when carrying out activation annealing, hydrogen is discharged from the capping film during the annealing and this discharge prevents hydrogen from being discharged from the semiconductor.

In a hexagonal group III nitride, a polar surface can be a c-plane and a non-polar surface can be a m-plane or an a-plane. When the primary surface of a semiconductor substrate used for crystal growth is inclined at relatively large angles with respect to reference planes perpendicular to the c-axis, a-axis and m-axis of the crystallographic coordinate system, the primary surface exhibits properties different from a polar plane or a non-polar plane. Orientation with an angle of inclination between −10 degrees and 10 degrees with respect to the c-axis has polar properties. Orientation with an angle of inclination in the range of −10 to 10 degrees with respect to the a-axis or m-axis has non-polar properties. Orientation with an angle of inclination outside the range of −10 to 10 degrees with respect to the c-axis and an angle of inclination outside the range of −10 to 10 degrees with respect to the a-axis or the m-axis has semi-polar properties.

From the perspective of hydrogen discharge during the activation annealing, an orientation with semi-polar properties exhibits poor hydrogen-discharging properties, whereby hydrogen is less likely to be removed in a semi-polar plane than in the c-plane. According to the findings of the inventors, when the angle between the normal axis of the primary surface of the semi-polar plane substrate and the c-axis of the group III nitride of the semi-polar plane substrate is in the range of not lower than 45 degrees and not higher than 80 degrees or not lower than 100 degrees and not higher than 135 degrees, hydrogen is far less likely to be removed in the semi-polar surface within these angle ranges than in the c-surface. When the semiconductor region 53, including the group III nitride semiconductor layer, is grown by organometallic vapor phase growth method on a semi-polar surface of an angle in the above ranges, the activation annealing according to the present embodiment can be applied to the semiconductor region 53.

The semiconductor region 53 can include a semi-polar surface that is made of a group III nitride semiconductor, and this semi-polar surface is in contact with the low hydrogen content film 55. In the semiconductor region having such a semi-polar surface, the release of hydrogen from the group III nitride semiconductor is less likely to occur than from a semiconductor region having a c-plane.

The low hydrogen content film 55 can be in contact with the group III nitride semiconductor layer. In this mode, hydrogen atoms moves from the group III nitride semiconductor layer in the semiconductor region 53, which has a higher hydrogen concentration, to the low hydrogen content film 55, which has a lower hydrogen concentration.

Figure 4A:
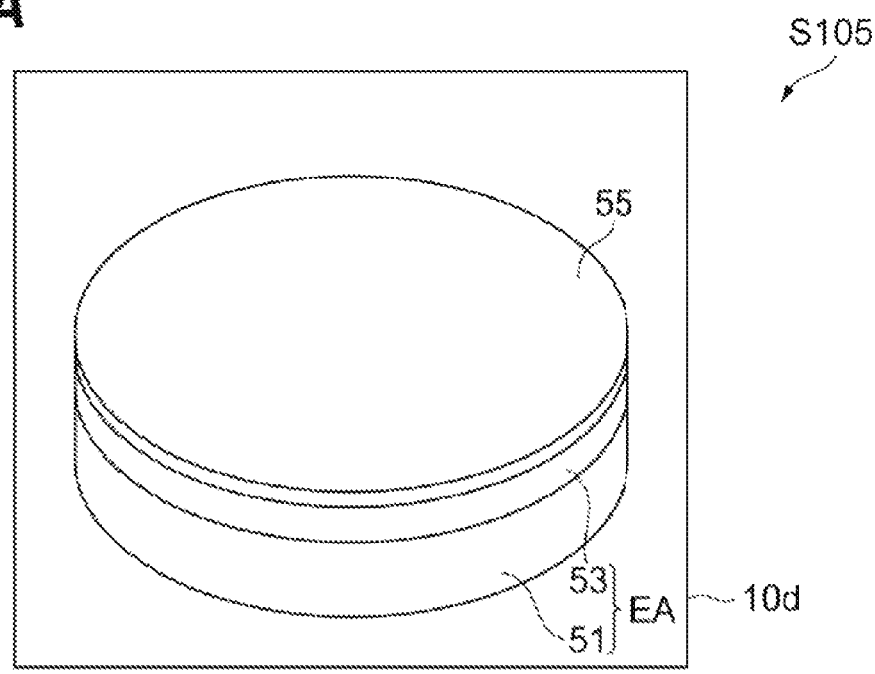
FIG. 4A is a drawing that schematically illustrates a main step in the method according to the present embodiment.

After forming the p-type group III nitride semiconductor layer, as shown in FIG. 4A, the low hydrogen content film may be removed in step S105, if necessary.

Removal of a silicon oxide, such as $SiO_2$, can be carried out by, for example, hydrofluoric wet acid etching or $CF_4$ dry etching. Removal of a zirconium oxide, such as $ZrO_2$, is carried out by using hydrofluoric acid or the like. Removal of an aluminum oxide, such as $Al_2O_3$, is carried out by using hydrofluoric acid or the like. Removal of a titanium oxide, such as $TiO_2$, is carried out by using hydrofluoric acid or the like. Removal of a tantalum oxide, such as $Ta_2O_5$, is carried out by using hydrofluoric acid or the like. Removal of titanium (Ti), palladium (Pd), nickel (Ni), cobalt (Co), platinum (Pt) and rhodium (Rh) is carried out by using hydrofluoric acid, nitrohydrochloric acid, hydrochloric acid, or the like.

Figure 4B:
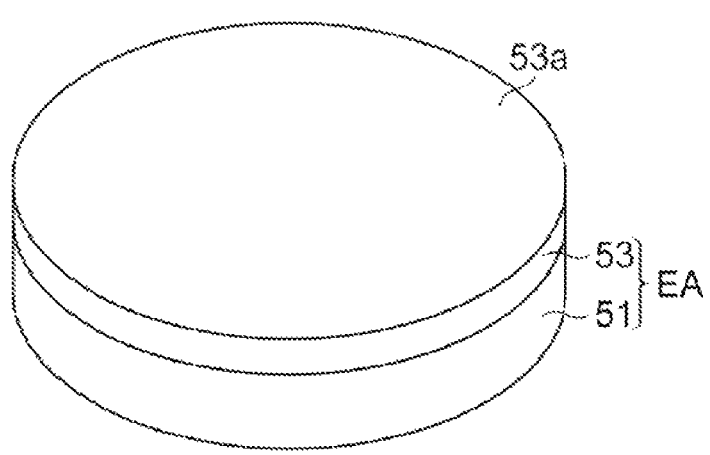
FIG. 4B is a drawing that schematically illustrates a main step in the method according to the present embodiment.

The low hydrogen content film 55 is removed, as shown in FIG. 4B, to expose the surface 53a of the semiconductor region 53 at the surface of the epitaxial substrate EA that has been subjected to the activation treatment. In the epitaxial substrate EA according to one example, a p-type group III nitride semiconductor layer, which is formed by modifying the group III nitride semiconductor layer through activation, is exposed on the top surface 53a of the semiconductor region 53. In the activation annealing, the low hydrogen content film 55 can reduce the loss of atoms from the surface of the p-type group III nitride semiconductor layer that is prepared for the device.

In a subsequent step, for example, a process for forming a ridge structure and forming an electrode is applied to the activation-annealed epitaxial substrate EA.

After removing the low hydrogen content film 55, a ridge structure is formed by processing the semiconductor region. A $SiO_2$ protective film is then formed on a p-side electrode and the sides of the ridge. In addition, the back surface is polished, and an n-side electrode is then formed thereon.

According to this method for fabricating a semiconductor device, the low hydrogen content film 55 is removed after being used in the heat treatment, and the removal can avoid complexities arising from the use of the low hydrogen content film 55 for other purposes. In the activation annealing, the low hydrogen content film 55 can reduce the loss of atoms from the surface of the p-type group III nitride semiconductor layer prepared for the device. Hydrogen moves from the group III nitride semiconductor layer with a higher hydrogen concentration to the low hydrogen content film with a lower hydrogen concentration.

Figure 5:
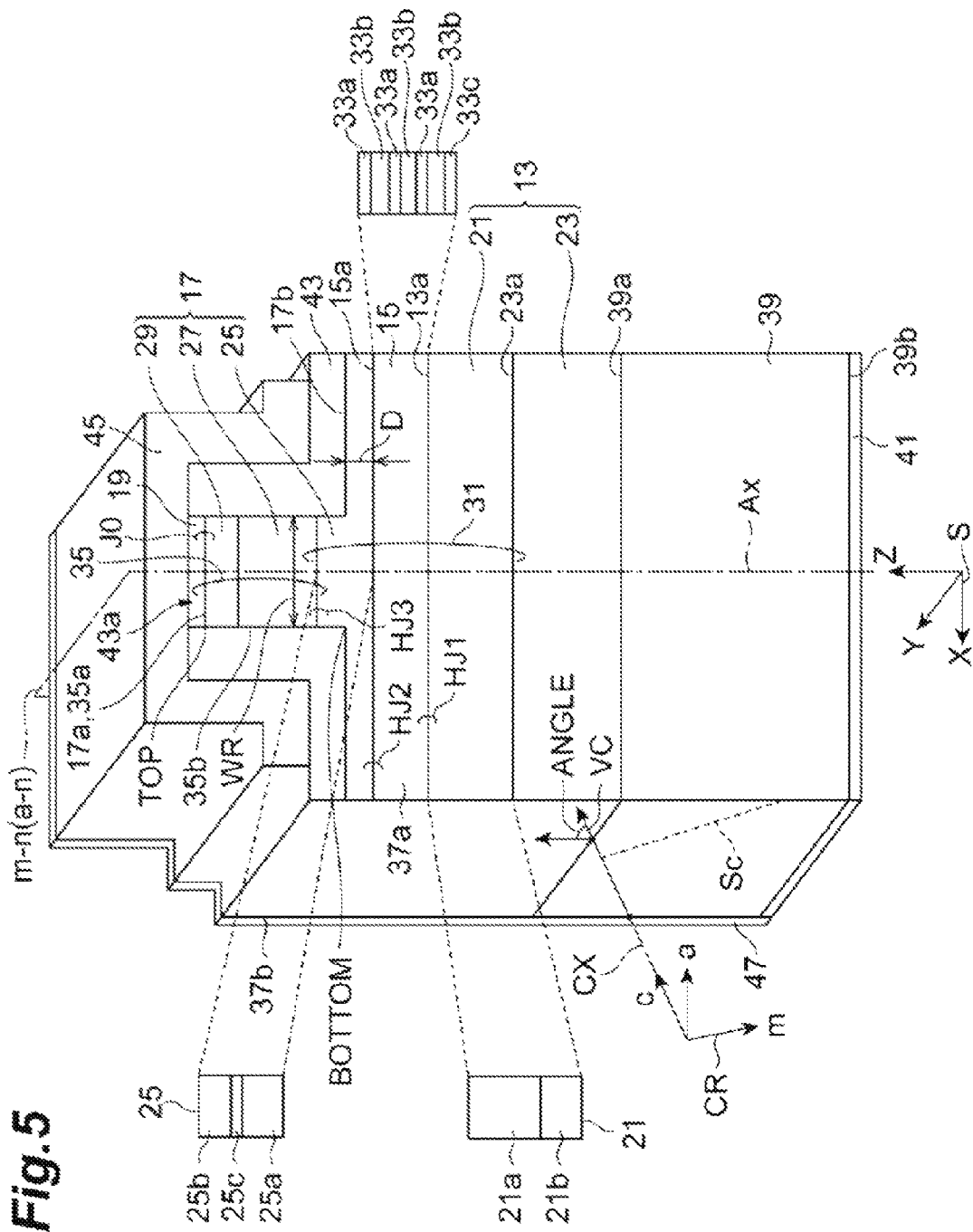
FIG. 5 is a drawing that shows the structure of a nitride semiconductor light-emitting device according to the present embodiment.

FIG. 5 is a drawing showing the structure of a nitride semiconductor light-emitting device according to the present embodiment. FIG. 5 shows an XYZ coordinate system S and a crystal coordinate system CR. The crystal coordinate system CR has a c-axis, an a-axis and an m-axis.

A group III nitride semiconductor laser device 11 includes a first group-III nitride semiconductor region 13, an active layer 15 and a second group-III nitride semiconductor region 17. The first group-III nitride semiconductor region 13 has a semi-polar surface 13a, which is made of a hexagonal group III nitride semiconductor. The active layer 15 is provided on the semi-polar surface 13a of the first group-III nitride semiconductor region 13. The second group-III nitride semiconductor region 17 is provided on the semi-polar surface 13a of the first group-III nitride semiconductor region 13. The active layer 15 is provided between the first group-III nitride semiconductor region 13 and the second group-III nitride semiconductor region 17. In addition, the lasing wavelength of the active layer 15 may be not lower than 400 nm and not higher than 550 nm. The lasing wavelength of the active layer 15 is preferably not lower than 480 nm and not higher than 550 nm, and more preferably not lower than 510 nm and not higher than 540 nm. The active layer 15 may have a quantum well structure, for example, a single quantum well structure or multiple quantum well structure. The first group-III nitride semiconductor region 13, the active layer 15 and the second group-III nitride semiconductor region 17 are arranged in order along a stacked axis Ax (direction of the Z-axis in the coordinate system S). An electrode 19 is provided on the second group-III nitride semiconductor region 17, and is in contact with a contact layer 29 of the second group-III nitride semiconductor region 17. The semi-polar surface 13a (like the primary surface of the substrate) is provided essentially parallel to a reference plane defined by the X- and Y-axes of the coordinate system S.

The first III-nitride semiconductor region 13 includes a optical guiding layer 21 and a first cladding layer 23. The optical guiding layer 21 is provided on the first cladding layer 23. The active layer 15 is provided on the optical guiding layer 21. The first cladding layer 23 is made of a group III nitride semiconductor of a first conductivity type (for example, n-type). The optical guiding layer 21 is provided between the active layer 15 and the first cladding layer 23, and is in contact with the active layer 15. The optical guiding layer 21 includes a first optical guiding layer 21a, and includes a gallium nitride semiconductor that contains indium as a constituent group III element. The second group-III nitride semiconductor region 17 is provided on the active layer 15. The second group-III nitride semiconductor region 17 includes another optical guiding layer 25 and a second cladding layer 27. The second cladding layer 27 is made of a group III nitride semiconductor of a second conductivity type (for example p-type), and is provided on the optical guiding layer 25. The optical guiding layer 25 is provided between the active layer 15 and the second cladding layer 27, and can be in contact with the active layer 15. The optical guiding layer 25 includes a second optical guiding layer 25a, and includes a gallium nitride semiconductor that contains indium as a constituent group III element. The second group-III nitride semiconductor region 17 has a ridge structure 35. If necessary, the optical guiding layer 25 can include a carrier blocking layer 25c.

The optical guiding layer 21 includes a first optical guiding layer 21a and a third optical guiding layer 21b. The first optical guiding layer 21a is located between the third optical guiding layer 21b and the active layer 15, and is in contact with the active layer 15. The third optical guiding layer 21b is made of a semiconductor different from the semiconductor material of the first optical guiding layer 21a, and the band gap of the third optical guiding layer 21b is larger than the band gap of the first optical guiding layer 21a.

The other optical guiding layer 25 includes the second optical guiding layer 25a and a fourth optical guiding layer 25b. The second optical guiding layer 25a is located between the fourth optical guiding layer 25b and the active layer 15, and is in contact with the active layer 15. The fourth optical guiding layer 25b is made of a semiconductor different from the semiconductor material of the second optical guiding layer 25a, and the band gap of the fourth optical guiding layer 25b is larger than the band gap of the second optical guiding layer 25a.

The optical guiding layer 21, the active layer 15 and the other optical guiding layer 25 constitute a core region 31, and the core region 31 is provided between the n-type cladding layer 23 and the p-type cladding layer 27. The n-type cladding layer 23, the core region 31 and the p-type cladding layer 27 constitute an optical waveguide structure.

The active layer 15 and the optical guiding layer 21 constitute a first heterojunction HJ1. The n-type cladding layer 23 is made of a group III nitride semiconductor, and the first heterojunction HJ1 is inclined at an angle of inclination (ANGLE) of more than zero degrees with respect to a reference plane Sc that extends along the c-plane of the group III nitride semiconductor of the n-type cladding layer 23. In FIG. 5, the reference plane in the n-type cladding layer 23 is substantially perpendicular to the axis that indicates the direction of the c-axis of the crystal coordinate system CR (the axis indicated by the vector "VC"). The active layer 15 and the optical guiding layer 25 constitute a second heterojunction HJ2. The second heterojunction HJ2 is inclined at an angle of inclination (ANGLE) of more than zero degrees with respect to a reference plane Sc that extends along the c-plane of the group III nitride semiconductor of the n-type cladding layer 23.

In addition, the semiconductor ridge 35 includes a third heterojunction HJ3 between the optical guiding layer 25 and the p-type cladding layer 27. The third heterojunction HJ3 is inclined at an angle of inclination (ANGLE) of more than zero degrees relative to a reference plane Sc that extends along the c-plane of the group III nitride semiconductor of the n-type cladding layer 23. The third heterojunction HJ3 is terminated by a side surface 35b of the semiconductor ridge 35. The semiconductor ridge 35 has a top (TOP) and a bottom (BOTTOM). The upper surface 35a of the semiconductor ridge 35 forms a junction J0 with the electrode 19.

The active layer 15 includes at least one well layer 33a, and this well layer 33a is made of, for example, a gallium nitride-based semiconductor. The well layer 33a incorporates compressive strain. The well layer 33a can include, for example, an InGaN layer. If necessary, the active layer 15 may include plural well layers 33a and at least one barrier layer 33b. The barrier layer 33b is provided between the well layers 33a mutually adjacent to each other. The outermost layer of the active layer 15 can be made of a well layer. The barrier layer 33b can be made of, for example, GaN or InGaN.

As already explained, the second group-III nitride semiconductor region 17 has a semiconductor ridge 35. The semiconductor ridge 35 includes a part of the optical guiding layer 25, the p-type cladding layer 27 and the p-type contact layer 29. The optical guiding layer 25 is provided so as to be in contact with the p-type cladding layer 27, and the p-type contact layer 29 is provided so as to be in contact with this p-type cladding layer 27. In the present embodiment, the semiconductor ridge 35 extends along the m-c plane that is defined by the c-axis and m-axis (or the a-c surface that is defined by the c-axis and a-axis) of the group III nitride semiconductor of the n-type cladding layer 23. In addition, in the present embodiment, the semiconductor ridge 35 extends along the m-n plane that is defined by the normal axis of the primary surface of the n-type cladding layer 23 (or the normal axis of the primary surface 39a of the substrate) and the m-axis (or the a-n plane that is defined by this normal axis and the a-axis). The c-axis of the group III nitride semiconductor can be inclined along the m-n plane (or the a-n plane). The semiconductor device (for example, the group III nitride semiconductor laser device 11) includes an end face 37a and an end face 37b, and in one embodiment, the end face 37a and end face 37b can constitute an optical cavity. In addition, the ridge structure 35 extending along the m-n plane makes it possible to use optical transitions that are able to reduce a threshold current for lasing. This structure contributes to not only the confinement performance of the ridge structure 35, but also a reduction in the threshold current.

According to this group III nitride semiconductor laser device 11, the second group-III nitride semiconductor region 17 has a ridge structure 35, and the ridge structure 35 can confine the current to the active layer 15 in proportion to the width of the ridge structure and also has an effect on optical confinement in the second group-III nitride semiconductor region 17. The thickness of the first optical guiding layer 21a in this group III nitride semiconductor laser device 11 is greater than the thickness of the second optical guiding layer 25a, and the first optical guiding layer 21a in the first group-III nitride semiconductor region 13 has a thickness of, for example, 370 nm or higher. This thickness range can reduce effects due to the width of the ridge structure 35 in terms of the optical confinement of this group III nitride semiconductor laser device 11. The current confinement of this group III nitride semiconductor laser device 11 is achieved mainly by the width WR of the ridge structure 35. In addition, optical confinement depends upon not only the thick first optical guiding layer 21a but also the ridge structure 35.

With reference to FIG. 5 again, an explanation will now be given of a group III nitride semiconductor laser device 11 according to the present embodiment. The group III nitride semiconductor laser device 11 can further include a substrate 39. The substrate 39 has a semi-polar primary surface 39a, which is made of a group III nitride semiconductor, and a back surface 39b. This semi-polar primary surface 39a can be inclined relative to a reference plane Sc, which is perpendicular to an axis that extends in the direction of the c-axis of the group III nitride semiconductor (the axis Cx indicated by the vector "VC"), and the angle formed by the semi-polar primary surface 39a and the reference plane Sc (an angle that is substantially equivalent to the angle "ANGLE") can be not lower than 10 degrees and not higher than 80 degrees or not lower than 100 degrees and not higher than 170 degrees. The first group-III nitride semiconductor region 13, the active layer 15 and the second group-III nitride semiconductor region 17 are provided on the semi-polar primary surface 39a. In the group III nitride semiconductor layer that is epitaxially grown on the substrate 39, the orientation of the surface of each individual semiconductor layer corresponds to that of the semi-polar surface of the substrate 39 and exhibits semi-polar properties. Accordingly, the surfaces of the first group-III nitride semiconductor region 13, the active layer 15 and the second group-III nitride semiconductor region 17 have an orientation that corresponds to the orientation of the semi-polar surface of the substrate 39.

The group III nitride semiconductor laser device 11 includes an electrode 41 in contact with the back surface 39b of the substrate 39. The substrate 39 can include, for example, an electrically-conductive hexagonal group III nitride, which is any one of GaN, InGaN, AlGaN, InAlGaN or BInAlGaN. The group III nitride semiconductor laser device 11 can include any one of GaN, InGaN, AlGaN, InAlGaN or BInAlGaN. The substrate 39 can be made of, for example, GaN. The InGaN layer that is epitaxially grown coherently on the GaN substrate incorporates compressive strain.

In addition, the angle of inclination (ANGLE) relating to the c-axis can be in the angle range of not lower than 63 degrees and not higher than 80 degrees when in the inclination defined along the m-n plane. The semi-polar surface 39a, which has this angle of inclination (ANGLE), enables the growth of a gallium nitride-based semiconductor with uniform indium incorporation and high indium content. In addition, the angle formed by the semi-polar primary surface 39a of the substrate 39 and the reference plane Sc can be not lower than 63 degrees and not higher than 80 degrees. In the group III nitride semiconductor laser device 11, the substrate 39 with a c-axis inclination of not lower than 63 degrees and not higher than 80 degrees in angle provides a favorable orientation for producing an active layer 15 that is suitable for long wavelength lasing.

In the group III nitride semiconductor laser device 11, the normal vector of the primary surface 39a of the substrate 39 is inclined relative to the c-axis of the group III nitride of the substrate 39, and the angle of this inclination can be not lower than 10 degrees and not higher than 80 degrees. If the angle of inclination of the c-axis of the group III nitride is lower than 10 degrees, the properties of the primary surface 39a are almost polar. If the angle of inclination of the c-axis of the group III nitride is higher than 80 degrees, the properties of the primary surface 39a are almost non-polar.

The lasing wavelength of the active layer 15 can be not lower than 480 nm and not higher than 550 nm. This group III nitride semiconductor laser device 11 can emit a laser beam of a relatively long wavelength. In addition, the active layer 15 can be provided in such a way as to generate an emission spectrum having a peak wavelength that falls within the range of not lower than 500 nm and not higher than 550 nm. The active layer 15, which produces an emission spectrum having a peak wavelength within the range of not lower than 500 nm and not higher than 550 nm, can be formed using a semi-polar surface. Furthermore, it is preferable that the emission wavelength of the active layer be in the range of not lower than 510 nm and not higher than 540 nm.

The group III nitride semiconductor laser device 11 can further include an ohmic electrode 19 that is provided on the upper surface 35a of the ridge structure 35. The second group-III nitride semiconductor region 17 further includes a contact layer 29 of a group III nitride semiconductor of a second conductivity type, the second cladding layer 27 is provided between the contact layer 29 and the optical guiding layer 25, and the ohmic electrode 19 can be in contact with the contact layer 29. Since the ohmic electrode 19 is in contact with the contact layer 29 located on the top surface 35a of the ridge structure 35, the ridge structure 35 can confine carriers from the ohmic electrode 19 depending upon the width of the ridge structure 35. It is preferable that the ohmic electrode 19 comprise, for example, palladium (Pd). The palladium can provide an excellent contact to the group III nitride semiconductor of the contact layer 29.

The group III nitride semiconductor laser device 11 can further include an insulating film 43 and a pad electrode 45. The insulating film 43 has an opening 43a, which is aligned with the upper surface 35a of the ridge structure 35, and covers the surface 17b of the second group-III nitride semiconductor region 17. The pad electrode 45 covers the upper surface of the ohmic electrode 19 and is provided on the insulating film 43. The insulating film 43 also covers the side surface 35b of the ridge structure 35, and the refractive index of the insulating film 43 is lower than the refractive index of the second group-III nitride semiconductor region 17. The ohmic electrode 19 is in contact with the upper surface 17a (43a) of the second group-III nitride semiconductor region 17 through the opening 43a of the insulating film 43. Since the refractive index of the insulating film 43 is lower than the refractive index of the second group-III nitride semiconductor region 17, the insulating film 43 that covers the side surface 35b of the ridge structure 35 is associated with the optical confinement.

In the group III nitride semiconductor laser device 11, the first cladding layer 23 can be $In_{X1}Al_{Y1}Ga_{1-X1-Y1}N$, which has n-type conductivity. This first cladding layer 23 can provide excellent optical confinement to the optical guiding layer 21. In addition, the second cladding layer 27 can be $In_{X2}Al_{Y2}Ga_{1-X2-Y2}N$, which has p-type conductivity. This second cladding layer 27 can provide excellent optical confinement to the optical guiding layer 25. In this group III nitride semiconductor laser device 11, the p-type semiconductor region is activated using the low hydrogen content film 55, which has a low hydrogen concentration, and the concentration of hydrogen remaining in the p-type semiconductor region is not lower than $5 \times 10^{16}$ cm$^{-3}$ (below the SIMS detection limit) and not higher than $1 \times 10^{20}$ cm$^{-3}$. In addition, the concentration of the p-type dopant in the p-type semiconductor region is not lower than $1 \times 10^{16}$ cm$^{-3}$ and not higher than $5 \times 10^{21}$ cm$^{-3}$. Within this p-type dopant concentration range, the ratio, [H]/[p], (the residual hydrogen concentration/p-type dopant concentration) is 25% or lower. In the p-type group III nitride semiconductor formed on the semi-polar surface, the concentration of H contained in the p-type layer is 25% or lower of the concentration of the p-type dopant in the p-type group III nitride semiconductor region formed on the substrate having a semi-polar surface of a group III nitride semiconductor, and the concentration of oxygen contained in the p-type layer is $5 \times 10^{17}$ atoms/cc (cubic centimeter) or lower. With regard to this p-type group III nitride semiconductor formed on a semi-polar surface, the inventors has found that, in order to achieve a sufficient activation effect, it is necessary to reduce the oxygen concentration of the p-type semiconductor layer on the semi-polar surface to $5 \times 10^{17}$ atoms/cc or lower.

EXAMPLE 1

Figure 6:
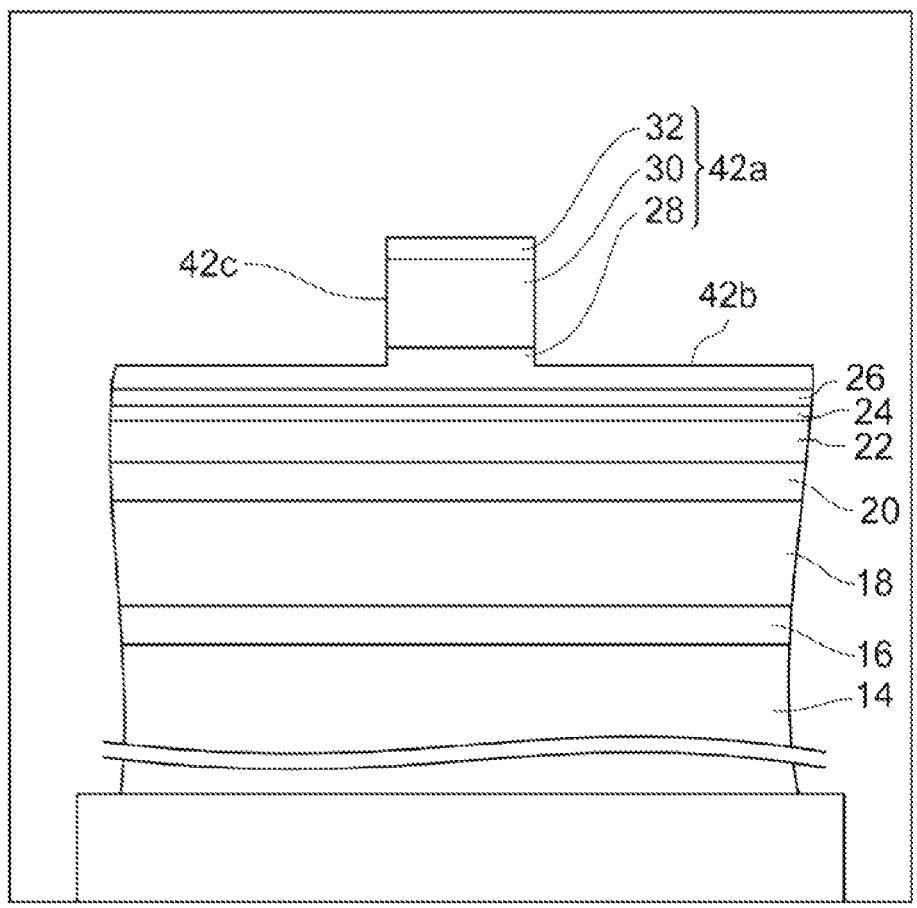
FIG. 6 is a drawing that shows a group III nitride semiconductor laser device produced in the example.

In this example, the group III nitride semiconductor laser device shown in FIG. 6 is fabricated. First, a semi-polar GaN substrate (for example, a wafer-like substrate) is prepared. The primary surface of this semi-polar GaN substrate can be, for example, {20-21} plane. In {20-21} plane, the c-axis of the GaN substrate is inclined at an angle of 75 degrees in the direction of the m-axis of the GaN with respect to the normal vector of the primary surface of the substrate, e.g., the direction of the c-axis to the m-axis. An epitaxial stack includes, for example, the following semiconductor layers: n-type gallium nitride-based semiconductor layer; n-type gallium nitride-based semiconductor cladding layer; n-side gallium nitride-based semiconductor optical guiding layer; active layer; p-side gallium nitride-based semiconductor optical guiding layer; gallium nitride-based semiconductor electron blocking layer; p-side gallium nitride-based semiconductor optical guiding layer; p-type gallium nitride-based semiconductor cladding layer; and p-type gallium nitride-based semiconductor contact layer. The active layer includes well layers and barrier layers, and the well layers and barrier layers are arranged alternately in the direction of the normal axis Nx.

An example of epitaxial stack 14.

N-type gallium nitride-based semiconductor layer 16: Si-doped n-type GaN.

N-type gallium nitride-based semiconductor cladding layer 18: Si-doped n-type AlGaN.

N-side gallium nitride-based semiconductor optical guiding layer 20: Si-doped n-type GaN, undoped InGaN.
Active layer 22: single or multiple quantum well structure. The active layer 22 is composed of well layers 22a and barrier layers 22b.
Well layer 22a: Undoped InGaN.
Barrier layer 22b: undoped InGaN or undoped GaN.
P-side gallium nitride-based semiconductor optical guiding layer 24: undoped InGaN.
Gallium nitride-based semiconductor electron blocking layer 26: Zn-doped p-type AlGaN.
P-side gallium nitride-based semiconductor optical guiding layer 28: Zn-doped p-type GaN.
P-type gallium nitride-based semiconductor cladding layer 30: Zn-doped p-type InAlGaN.
P-type gallium nitride-based semiconductor contact layer 32: Zn-doped p-type GaN.

An epitaxial substrate can be fabricated on a semi-polar surface in the same way by carrying out epitaxial growth under similar film formation conditions on a polar surface or non-polar surface. It is possible to use Mg instead of Zn as the p-type dopant.

A semiconductor ridge 42a includes the p-type gallium nitride-based semiconductor contact layer 32, the p-type gallium nitride-based semiconductor cladding layer 30 and the p-side gallium nitride-based semiconductor optical guiding layer 28. In order to form the semiconductor ridge by etching, the group III nitride semiconductor layers 28, 30 and 32 are etched such that these group III nitride semiconductor layers 28, 30 and 32 appear on the surface 42b of the etched nitride semiconductor region and the side surface 42c of the semiconductor ridge 42a.

Before carrying out photolithography, dry etching and vacuum deposition, this epitaxial substrate is subjected to activation annealing by use of the low hydrogen content film 55 according to the present embodiment. After carrying out the activation annealing, the epitaxial substrate is subjected to photolithography, dry etching and vacuum deposition, thereby producing a ridge-type gallium nitride-based semiconductor laser having a semiconductor ridge of 2 μm in width and an optical cavity of 600 μm in length. In a region in which the p-type dopant concentration in the p-type semiconductor region is $1\times10^{21}$ cm$^{-3}$, the ratio, [H]/[p], (the residual hydrogen concentration/p-type dopant concentration) is 8%.

After forming the ridge structure and the electrode, end facets for the optical cavity are formed by fracturing the substrate product. A dielectric multilayer film is formed on these end facets. The dielectric multilayer film is made of, for example, $SiO_2/TiO_2$. By carrying out these steps, a semiconductor laser is produced on the {20-21} plane, which is inclined at an angle of 75 degrees toward the direction of the m-axis, of the semi-polar GaN substrate. This semiconductor laser emits light in the 520-nm wavelength band.

EXAMPLE 2

Three GaN substrates are prepared. The orientation of the primary surfaces of the GaN substrates is, for example, {20-21}. Epitaxial wafers having laser structures are produced by epitaxially growing a Si-doped n-type GaN buffer layer, a Si-doped n-type AlGaN cladding layer, a Si-doped n-type InGaN guide layer, an undoped InGaN active layer, a Mg-doped AlGaN electron blocking layer, a Mg-doped InGaN optical guiding layer, a Mg-doped AlGaN cladding layer and a Mg-doped GaN contact layer in that order on these GaN substrates. After subjecting these epitaxial wafers to activation annealing, an electrode film of an ohmic metal (for example, a Pd layer) is produced on the GaN contact layer by a vapor deposition method. The thickness of this metal layer is, for example, 30 nm. After forming a dry etching mask on this metal layer, a ridge structure is formed using the mask by dry etching.

In Experiment 1, a low hydrogen content film for activation annealing is deposited by electron beam vapor deposition. Pellet-like silicon oxide is used as raw material for the electron beam vapor deposition. The hydrogen concentration in the pellets is $1\times10^{20}$ cm$^{-3}$ or lower.

In Experiment 2, a low hydrogen content film for activation annealing is deposited by plasma CVD. A mixed gas containing hydrogen-diluted silane, $SiH_4$ (10%) and $O_2$, is used as the raw material for the plasma CVD.

In Experiment 3, a low hydrogen content film is not formed, and when activation annealing is carried out, the Mg-doped GaN contact layer is exposed which is located at the top surface of the epitaxial wafer.

In the three experiments, a lamp annealer using $N_2$ atmosphere is used for the treatment. The annealing time is one minute in each experiment. The contact resistance and sheet resistance are measured for each of the activation annealing temperatures, and changes in the values between before and after heat treatment are also investigated. Moreover, $N_2$ or Ar can be used as the annealing atmosphere.

Contact resistance (units: $\times10^{-4}\Omega\cdot cm^2$).

| Heat treatment temperature (degrees Celsius) | Film 1, | Film 2, | Film 3. |
|---|---|---|---|
| 880 degrees Celsius, | 5.0, | 8.0, | 5.0; |
| 960 degrees Celsius, | 3.3, | 8.0, | 10.0; |
| 1000 degrees Celsius, | 2.0, | 9.0, | 20.0; |
| 1040 degrees Celsius, | 1.4, | 20.0, | 20.0. |

Heat treatment is carried out at temperatures in the range of 880 degrees Celsius to 1040 degrees Celsius. In the experiment for Film 1, better results can be achieved than that for Film 2 within the above temperature range. A Transmission Line Model (TLM) method is used to measure contact resistance. An excellent contact resistance obtained by the application of the present activation annealing is $1\times10^{-3}\Omega cm^2$ or lower.

Sheet resistance (units: $\Omega/cm^2$)

| Heat treatment temperature, (degrees Celsius) | Film 1, | Film 2, | Film 3. |
|---|---|---|---|
| 880 degrees Celsius, | 2.1, | 2.5, | 2.7; |
| 960 degrees Celsius, | 1.9, | 2.3, | 2.5; |
| 1000 degrees Celsius, | 1.9, | 2.3, | 2.5; |
| 1040 degrees Celsius, | 1.9, | 2.3, | 2.5. |

Heat treatment is carried out at temperatures within 880 degrees Celsius to 1040 degrees Celsius. In the experiment for Film 1, excellent results can be achieved than Film 2 within the above temperature range. An excellent sheet resistance obtained by the application of this activation annealing is $2.0\Omega/cm^2$ or lower.

In Experiment 1, the hydrogen concentration in the low hydrogen content film made of a silicon oxide is $2\times10^{18}$ cm$^{-3}$ (it is preferable that the concentration of hydrogen in the low hydrogen content film be $2\times10^{18}$ cm$^{-3}$ or lower). In Experiment 2, the hydrogen concentration in the low hydrogen content film made of a silicon oxide is $1\times10^{21}$ cm$^{-3}$.

These hydrogen concentrations are measured using a SIMS method. These experiments are not limited to using Mg-doped GaN, and similar results can be obtained by using Zn or the like.

The silicon oxide (for example, $SiO_2$) formed by vapor deposition is obtained from raw materials that do not contain hydrogen, and therefore has a low hydrogen content. However, there is the possibility that moisture will be adsorbed during film formation, and adsorbed moisture can be decomposed by heating to generate atomic hydrogen. It is, therefore, desirable to be able to provide a silicon oxide film with high purity. This type of film formation is provided by a method such as ion assisted vapor deposition. In addition, preferably, the vapor deposited film can be easily removed by wet etching or the like after annealing.

In order to prevent surface contamination, it is not possible to use a silicon oxide film formed in a wet process, such as one formed by firing a applied film from Spin On Glass (SOG) that is dissolved in (for example) an organic solvent, which is not a dry process. Such a film includes residual impurities such as carbon or oxygen that may remain on the surface of GaN, resulting in that the contact resistance of an electrode deteriorates.

In a chemical vapor phase growth method such as plasma CVD or thermal CVD, film forming methods using a hydrogen-containing raw material, such as a silane-based gas (for example, $SiH_4$) or an organic silane-based gas (for example, TEOS (tetraethyl orthosilicate, tetraethoxysilane)) makes it extremely difficult to reduce the concentration of hydrogen in the resultant film. Meanwhile, it is desirable to use an evaporation method as a growth film formation method using vapor phase, and it is easy to control the concentration of hydrogen in the raw materials when carrying out a vapor deposition method. As a vapor deposition method, the following methods can be preferred: for example, electron beam vapor deposition. Electron beam vapor deposition can reduce surface damage, when compared to a vapor deposition method in which the resultant surface is exposed to plasma, such as ion plating vapor deposition.

In addition, s, it is desirable to carry out vapor deposition film formation while heating to a temperature of not lower than 100 degrees Celsius or higher because electron beam vapor deposition also involves the possibility of moisture remaining on the epi-surface, which causes adverse effect. In order to prevent roughening of the epitaxial surface and increase in the contact resistance, it is desirable that the upper limit of the heating temperature be approximately 400 degrees Celsius during vapor deposition, and too high temperature during the vapor deposition cause such deteriorations. The vapor deposition at a temperature of approximately 300 degrees Celsius or higher can facilitate migration to improve the film density, thereby providing a highly dense film.

The present invention is not limited to the specific constitution disclosed in the present embodiment. In the present embodiment, explanations have been given of working examples in which the activation annealing is applied to a light-emitting device, such as a laser diode, light-emitting diode, or the like, but the semiconductor device is not limited to such light-emitting devices, and may comprise an electronic device.

In addition, the following experiment was carried out as another method. The amounts of residual hydrogen were estimated in a case in which heat treatment was carried out without forming a low hydrogen content film and a case in which Ti was formed on another surface of the substrate and the other surface can be opposite to the surface on which a p-type group III nitride was formed. The amounts of residual hydrogen were measured by SIMS. The results obtained under conditions in which Ti was formed on the other surface showed that the amounts of residual hydrogen were reduced to between one fifth and one tenth of the amount measured in a case without Ti formed on the backside surface (see FIG. 7). In this way, it is not essential that a low hydrogen content film be in direct contact with a p-type group III nitride, and even if a low hydrogen content film is in indirect contact with a p-type group III nitride via another member, such as a nitride semiconductor having a different electrical conductivity type, it is possible to facilitate removal of hydrogen.

According to the present embodiment, it is possible to provide a method for producing a p-type group III nitride semiconductor that facilitates activation of a p-type dopant in a group III nitride semiconductor. According to the present embodiment, it is also possible to provide a method for fabricating a semiconductor device, by which it is possible to protect the surface of a semiconductor and to activate a p-type dopant in a group III nitride semiconductor.

The principles of the present invention have been illustrated and explained using preferred embodiments, but a person skilled in the art would recognize that the present invention could be modified in terms of configuration and details without deviating from such principles. Therefore, we claim rights to all amendments and alterations obtained from the scope and spirit of the claims.

What is claimed is:

1. A method for fabricating a group III nitride semiconductor device, comprising the steps of:

growing a low hydrogen content film on a semiconductor region including a group III nitride semiconductor layer, the group III nitride semiconductor layer including a p-type dopant, the low hydrogen content film being made of a material different from a group III nitride, the low hydrogen content film having a hydrogen concentration of $1 \times 10^{20}$ cm$^{-3}$ or lower, an angle between a normal axis of a primary surface of a semi-polar plane substrate and a c-axis of the semi-polar plane substrate is not lower than 45 degrees and not higher than 80 degrees or not lower than 100 degrees and not higher than 135 degrees in a waveguide axis direction of the group III nitride semiconductor device; and carrying out activation annealing of the semiconductor region to form a p-type group III nitride semiconductor layer from the group III nitride semiconductor layer, after growing the low hydrogen content film.

2. The method according to claim 1, wherein the step of growing a low hydrogen content film includes growing the low hydrogen content film in a film formation apparatus without using a substance containing hydrogen.

3. The method according to claim 1, wherein the activation annealing is carried out at a temperature of 600 degrees Celsius or higher.

4. The method according to claim 1, wherein the low hydrogen content film includes a dielectric body.

5. The method according to claim 4, wherein the low hydrogen content film comprises at least one of a silicon oxide, a zirconium oxide, an aluminum oxide, a titanium oxide or a tantalum oxide.

6. The method according to claim 1, wherein the low hydrogen content film includes a metal with hydrogen storage properties.

7. The method according to claim 6, wherein the low hydrogen content film contains at least one of titanium (Ti), palladium (Pd), nickel (Ni), cobalt (Co), platinum (Pt) or rhodium (Rh).

8. The method according to claim 1, wherein the low hydrogen content film is formed by a vapor phase growth method.

9. The method according to claim 1, wherein the low hydrogen content film is formed by an evaporation method.

10. The method according to claim 1, wherein the low hydrogen content film is formed by an electron beam vapor deposition method.

11. The method according to claim 1, further comprising a step of, after the step of forming the p-type group III nitride semiconductor layer, removing the low hydrogen content film on the surface of the semiconductor region to expose the p-type group III nitride semiconductor layer.

12. The method according to claim 1, further comprising a step of, after the step of forming the p-type group III nitride semiconductor layer, processing the p-type group III nitride semiconductor layer so as to form a ridge structure, wherein the ridge structure extends along a reference plane defined by the c-axis and one of m- and a-axes of the substrate.

13. The method according to claim 1, wherein the group III nitride semiconductor layer comprises at least one of a Mg-doped GaN layer, a Mg-doped AlN layer, a Mg-doped InN layer, a Mg-doped AlGaN layer, a Mg-doped InGaN layer, a Mg-doped InAlGaN layer or a Mg-doped InAlN layer.

\* \* \* \* \*